(12) United States Patent
Saito et al.

(10) Patent No.: US 7,747,028 B2
(45) Date of Patent: Jun. 29, 2010

(54) APPARATUS AND METHOD FOR IMPROVING VOICE CLARITY

(75) Inventors: Nozomu Saito, Iwaki (JP); Toru Marumoto, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 1519 days.

(21) Appl. No.: 11/070,837

(22) Filed: Mar. 2, 2005

(65) Prior Publication Data
US 2005/0195994 A1    Sep. 8, 2005

(30) Foreign Application Priority Data
Mar. 3, 2004    (JP)    ............... 2004-058706

(51) Int. Cl.
*H03G 3/00*    (2006.01)
(52) U.S. Cl. ............... 381/107; 381/102; 381/104; 381/57
(58) Field of Classification Search ............. 381/56–57, 381/101–102, 104–109
See application file for complete search history.

(56) References Cited

U.S. PATENT DOCUMENTS

| 4,891,605 A | 1/1990 | Tirkel |
| 5,615,270 A | 3/1997 | Miller et al. |
| 6,760,453 B1 * | 7/2004 | Banno ..................... 381/107 |
| 6,873,837 B1 * | 3/2005 | Yoshioka et al. ............ 455/321 |
| 7,050,591 B2 * | 5/2006 | Marumoto .................... 381/58 |
| 7,142,678 B2 * | 11/2006 | Falcon ......................... 381/107 |
| 2004/0101145 A1 * | 5/2004 | Falcon ......................... 381/64 |

FOREIGN PATENT DOCUMENTS

| JP | 11-166835 | 6/1999 |
| JP | 2002-213985 | 7/2002 |

* cited by examiner

*Primary Examiner*—Vivian Chin
*Assistant Examiner*—Disler Paul
(74) *Attorney, Agent, or Firm*—Brinks Hofer Gilson & Lione

(57) ABSTRACT

In an apparatus for improving voice clarity by controlling a gain of a voice based on a sound pressure level of the voice and a sound pressure level of noise, it is determined whether a sound pressure level of a gain-controlled voice exceeds a maximum allowable level. If the sound pressure level exceeding the maximum allowable level is caused by audio sound, a sound pressure level of the audio sound is reduced. The sound pressure level of the audio sound is minimally reduced so that the sound pressure level of the voice becomes equal to or lower than the maximum allowable level.

17 Claims, 9 Drawing Sheets

FIG. 3

| VOLUME VALUE | Pa (dB SPL) |
|---|---|
| 1 | 56 |
| 2 | 58 |
| 3 | 60 |
| 4 | 62 |
| ⋮ | ⋮ |

PRIOR ART

PRIOR ART

APPARATUS AND METHOD FOR IMPROVING VOICE CLARITY

BACKGROUND OF THE INVENTION

1. Field of the Invention

The present invention relates to an apparatus and method for improving voice clarity. More specifically, the present invention relates to an apparatus and method for improving voice clarity to provide improved intelligibility of voice navigation even in a noisy environment while considering a maximum allowable volume level safe for protection against hearing loss.

2. Description of the Related Art

Commercially available vehicle navigation systems and hands-free telephone systems may include a voice output device that employs an apparatus for improving voice clarity using loudness compensation. Such voice-clarity improving apparatuses may provide intelligible voice navigation or guidance instruction in noisy environments that include the sound of audio playback in a vehicle, the sound of the vehicle engine, and the sound of traveling, where it is difficult to hear voice navigation or guidance instruction. The volume level can be appropriately adjusted depending upon the level of noise.

FIG. 7 is a block diagram of a voice-clarity improving apparatus of the related art (see, for example, Japanese Unexamined Patent Application Publication No. 11-166835). The voice-clarity improving apparatus 1 includes a volume adjusting unit 11 for manually adjusting the volume level of a voice signal, and a gain corrector 12 including an attenuator and a variable gain unit for controlling a gain G of the voice signal so as to provide a clear voice. The voice-clarity improving apparatus 1 further includes an amplifier 13 for amplifying the voice signal, a speaker 14 for radiating a voice into the vehicle cabin, a microphone 15 for detecting a combination of noise and voice, a signal separating unit 16 for separating and outputting a voice signal and a noise signal, a loudness-compensation-based gain determining unit 17 for determining a gain Gopt of a voice signal using loudness compensation so that a clear voice can be reproduced, a white noise source 18 for use in determining transmission characteristics of an acoustic communication system including the speaker 14 and the microphone 15, and a switch 19.

An audio sound playback unit 2 is separate from the voice-clarity improving apparatus 1. The audio sound playback unit 2 includes an audio source 21, such as a compact disc (CD) player, a Mini-Disk player, or a tuner, an amplifier 22, and a speaker 23. Audio playback sound is output from the speaker 23.

In the voice-clarity improving apparatus 1, the volume adjusting unit 11 adjusts the volume level of a voice-navigation signal input from a navigation apparatus. The gain corrector 12 multiplies the gain Gopt determined by the loudness-compensation-based gain determining unit 17 to the volume-adjusted voice-navigation signal. The amplifier 13 amplifies the voice-navigation signal output from the gain corrector 12. The speaker 14 radiates the voice navigation input from the amplifier 13 into the vehicle cabin. The microphone 15 receives a combination of the audio playback sound output from the speaker 23 of the audio sound playback unit 2, environmental noise, and voice navigation, and inputs the combined sound to the signal separating unit 16.

The signal separating unit 16 separates a voice signal and a noise signal that is a composite signal having an audio playback sound signal and a noise signal. The signal separating unit 16 includes an identification filter 16a for simulating an impulse response of the acoustic communication system including the speaker 14 and the microphone 15, a calculating unit 16b, and an adaptive control device 16c. The adaptive control device 16c includes a least-mean-square (LMS) adaptive controller 31 and an adaptive filter 32. The adaptive controller 31 performs adaptive control to identify an impulse response of the acoustic communication system including the speaker 14 and the microphone 15, and passes the identified impulse response to the adaptive filter 32. The transmission characteristics of the acoustic communication system determined by adaptive control are copied to the identification filter 16a.

The loudness-compensation-based gain determining unit 17 determines the optimum gain Gopt to be added to the voice-navigation signal based on the voice-navigation signal output from the identification filter 16a and the noise signal (i.e., the audio playback sound signal and the noise signal) outputted from the calculating unit 16b, and inputs the gain Gopt to the gain corrector 12.

The principle of determining the gain using loudness compensation will now be described.

FIG. 8 is a loudness curve indicating the relationship between the physical sound pressure level and the magnitude of physiological sensation produced by a sound (hereinafter referred to as "loudness"). In the loudness curve shown in FIG. 8, the x axis indicates the sound pressure level (SPL) in decibels (dB), and the y axis indicates the loudness in sones. In FIG. 8, a loudness curve (a) is exhibited in a quiet environment, and a loudness curve (b) is exhibited in a noisy environment where the minimum value of human audible sensation produced by a sound is about 35 dB higher. The loudness curve (b) varies depending upon the noise.

The loudness curve indicates that a sound having the same loudness on the y axis is perceived as the same sound. In FIG. 8, a sound with a loudness of 0.1 sone is perceived only at an SPL of 12 dB in the quiet environment indicated by the loudness curve (a), and is perceived at an SPL of 37 dB in the noisy environment indicated by the loudness curve (b). In other words, in order to perceive a sound having the same magnitude as that perceived at an SPL of 12 dB in the quiet environment indicated by the loudness curve (a), the sound must have an SPL of 37 dB in the noisy environment indicated by the loudness curve (b). In this case, an additional gain of 25 dB is required. A sound having one sone is perceivable at an SPL of 42 dB in the quiet environment indicated by the loudness curve (a), and is perceivable at an SPL of 49 dB in the noisy environment indicated by the loudness curve (b). In this case, an additional gain of 7 dB is required. Gain is therefore changed depending upon the level of the voice-navigation signal in noisy environments.

FIG. 9 is a graph showing the relationship between the voice signal level and the gain in a noisy environment. In FIG. 9, the x axis indicates the SPL (corresponding to the level of the voice signal) in a quiet environment, and the y axis indicates the gain required to perceive a sound in the noisy environment indicated by the loudness curve (b) shown in FIG. 8 as a sound having the same magnitude as that in a quiet environment. As indicated by the loudness curve (b) shown in FIG. 8, a noisy environment where the minimum value of human audible sensation produced by a sound is about 35 dB higher has been described by way of example.

As shown in FIG. 10, the loudness curve also changes as the noise level changes, and therefore the gain-to-signal characteristic also changes depending upon the noisy environment, as shown in FIG. 11. In FIG. 10, a loudness curve (a) is an optimum curve in which the loudness f is given by the following equation:

$$f = KI$$

where I denotes the intensity of sound. A loudness curve (b) is exhibited in an environment with physiological noise, such as blood flowing sounds, without external noise (this environment corresponds to the quiet environment indicated by the loudness curve (a) shown in FIG. 8). A loudness curve (c) is exhibited in a noisy environment where the minimum value of audible sensation produced by a sound is 15 dB higher. A loudness curve (d) is exhibited in a noisy environment where the minimum value is 35 dB higher, and a loudness curve (e) is exhibited in a noisy environment where the minimum value is 55 dB higher.

The loudness-compensation-based gain determining unit 17 stores gain-to-signal characteristics (see FIG. 11) for various noise levels in an internal memory in advance, and selects a gain-to-signal characteristic for an actual noise level in a vehicle cabin. Then, the loudness-compensation-based gain determining unit 17 determines the gain Gopt optimum for the level of the voice-navigation signal based on the selected gain-to-signal characteristic, and inputs the optimum gain Gopt to the gain corrector 12. The gain corrector 12 multiples the optimum gain Gopt to the voice-navigation signal. Therefore, even in a noisy environment, a user can perceive a sound having the equivalent level to that in a quiet environment.

In the voice-clarity improving apparatus 1 shown in FIG. 7, before starting normal operation, it is necessary to identify an impulse response of the acoustic communication propagation system including the speaker 14 and the microphone 15 and to set the identified impulse response in the identification filter 16a. When the impulse response is identified, the voice signal and the audio playback sound signal are set to 0. In this state, the white noise source 18 is activated, and the switch 19 is turned on. Then, white noise is radiated into an acoustic space in the vehicle cabin from the speaker 14 through the amplifier 13, and is detected by the microphone 15. The white noise is also input to the adaptive control device 16c, and is then filtered by the adaptive filter 32.

The calculating unit 16b subtracts the output signal of the adaptive filter 32 from the detection signal of the microphone 15, and feeds back the difference to the adaptive control device 16c as an error signal. The adaptive controller 31 performs adaptive control using an LMS algorithm so that the power of the error signal can be minimized to determine a coefficient of the adaptive filter (finite impulse response (FIR) filter) 32. The adaptive control described above is repeatedly performed until the output of the adaptive filter 32 is equal to the output of the microphone 15, and therefore the impulse response of the acoustic communication system is set in the adaptive filter 32. More specifically, the impulse response characteristics, i.e., the transmission characteristics, from an input from the amplifier 13 to the microphone 15 are set in the adaptive filter 32.

After the impulse response of the acoustic communication system is identified, the coefficient of the adaptive filter 32 is copied to the identification filter 16a. Then, the switch 10 is turned off to enable normal operation.

In the normal operation, the identification filter 16a applies the impulse response characteristic of the acoustic communication system to the voice-navigation signal input via the volume adjusting unit 11 and the gain corrector 12 to generate a pseudo audio signal at the observation point (i.e., at the position of the microphone 15), and inputs the audio signal to the loudness-compensation-based gain determining unit 17. The calculating unit 16b subtracts the voice-navigation signal from the combined-sound signal at the observation point, which is output from the microphone 15, to generate a noise signal (including audio playback sound and external noise), and inputs the noise signal to the loudness-compensation-based gain determining unit 17.

The loudness-compensation-based gain determining unit 17 selects a gain-to-signal characteristic for the noise level to determine the gain Gopt optimum for the level of the voice-navigation signal based on the selected gain-to-signal characteristic, and inputs the optimum gain Gopt to the gain corrector 12. That is, the loudness-compensation-based gain determining unit 17 inputs the optimum gain Gopt to the gain corrector 12 in order to make the loudness of the voice-navigation signal in a noisy environment equal to the loudness of the voice-navigation signal in a quiet environment. The gain corrector 12 multiplies the optimum gain Gopt to the input voice-navigation signal. The above-described control is repeatedly performed, so that a user can receive the voice navigation even in a noisy environment in the same way as in a noiseless environment.

With the ability to reduce noise in vehicle cabins and the prevalence of in-vehicle devices, such as vehicle audio devices, audio-visual devices, and navigation systems (such devices are hereinafter referred to as "AV devices"), users often listen to AV sources (including music, TV sound, and voice navigation) in vehicle cabins. The amplification level for the AV sources can be increased to any desired level. In vehicle cabins, which are convenient private spaces, users often listen to the AV sources at a higher volume level than usual (e.g., at home).

In a noisy environment where audio is played back, it is typically necessary to correct the voice-navigation signal so as to have a level higher than noise to receive voice navigation. However, it is undesirable for the voice-clarity improving apparatus to increase the gain of the voice signal for any noise level without limit. Sound with too high a volume level can cause hearing loss.

Generally, passengers who are in a loud AV source environment for a long time can often suffer from hearing loss. Although depending upon the individual, it is said that people exposed to a daily noise level of 80 dB or higher will possibly suffer from hearing impairment. In France, a sound limit of 100 dBA was set by law, and a maximum output level lower than 100 dBA for stereo headphone volume has been regulated and enforced since 1998.

Therefore, there is a demand for a voice-clarity improving apparatus with a maximum gain of voice navigation safe for protection against hearing loss. Mere control of the maximum gain does not allow a user to sufficiently hear a voice in a noisy environment where audio is played back.

SUMMARY OF THE INVENTION

It is an object of the present invention to control the voice gain to a level that does not cause hearing loss and to provide improved intelligibility of voice reproduction.

It is another object of the present invention to reduce the audio sound level so that the volume level of gain-corrected voice, which is caused by audio sound to exceed an allowable value, does not exceed the allowable value.

It is still another object of the present invention to minimally increase the voice gain to a level that does not cause hearing loss to provide a high intelligible voice when the volume level of gain-corrected voice is caused by external noise rather than audio sound to exceed an allowable value.

One or more of the foregoing objects may be achieved through the provision of a method for improving voice clarity by controlling a gain of a voice based on a sound pressure level of the voice and a sound pressure level of noise.

The method according to a first embodiment of the present invention includes determining whether a sound pressure level of a gain-controlled voice exceeds a maximum allowable level, and reducing a sound pressure level of audio sound when the sound pressure level of the gain-controlled voice exceeds the maximum allowable level. When the sound pressure level of the gain-controlled voice exceeds the maximum allowable level, it may be determined whether the sound pressure level exceeding the maximum allowable level is caused by the audio sound, and the sound pressure level of the audio sound may be reduced when the sound pressure level exceeding the maximum allowable level is caused by the audio sound. The sound pressure level of the audio sound may be minimally reduced so that the sound pressure level of the gain-controlled voice becomes equal to or lower than the maximum allowable level.

The method according to a second embodiment of the present invention includes generating and storing a correspondence (gain-to-signal characteristic) between a sound pressure level of a voice and the gain of the voice for each sound pressure level of noise using loudness compensation, determining a sound pressure level of noise and a sound pressure level of a voice, determining the gain based on the sound pressure level of the voice and the correspondence with respect to the sound pressure level of the noise, determining whether a sound pressure level of the voice to which the determined gain is applied exceeds a maximum allowable level, when the sound pressure level exceeds the maximum allowable level, determining whether the sound pressure level exceeding the maximum allowable level is caused by audio sound, and reducing the sound pressure level of the audio sound when the sound pressure level exceeding the maximum allowable level is caused by the audio sound.

It may be determined whether the sound pressure level exceeding the maximum allowable level is caused by the audio sound according to a process including determining a sound pressure level of first noise that is the audio sound, determining a sound pressure level of second noise other than the audio sound based on a sound pressure level of all noise and the sound pressure level of the first noise, determining a gain based on the correspondence with respect to the sound pressure level of the second noise and a sound pressure level of the voice to which the gain has not been applied, determining whether a sound pressure level of a voice signal to which the determined gain is applied exceeds the maximum allowable level, and determining that the sound pressure level exceeding the maximum allowable level is caused by the audio sound when the sound pressure level of the voice signal to which the determined gain is applied does not exceed the maximum allowable level. The sound pressure level of the first noise may be determined based on a set volume value of the audio sound.

When the sound pressure level exceeding the maximum allowable level is caused by the audio sound, the sound pressure level of the audio sound may be minimally reduced so that the sound pressure level of the voice to which the gain is applied becomes equal to or lower than the maximum allowable level. That is, when the sound pressure level exceeding the maximum allowable level is caused by the audio sound, a gain may be determined based on the correspondence with respect to the sound pressure level of all noise and the sound pressure level of the voice while assuming that the sound pressure level of all noise is a preset value higher than the sound pressure level of the second noise, and it may be determined whether a sound pressure level of the voice signal to which the determined gain is applied exceeds the maximum allowable level. When the sound pressure level of the voice signal to which the determined gain is applied does not exceed the maximum allowable level, a gain may be repeatedly determined based on the correspondence with respect to the sound pressure level of all noise and the sound pressure level of the voice while assuming that the sound pressure level of all noise is still the preset value higher, a maximum sound pressure level of all noise that does not exceed the maximum allowable level may be determined, and the sound pressure level of the first noise that is the audio sound may be determined based on the sound pressure level of all noise and the sound pressure level of the second noise.

In the method according to the second embodiment of the present invention, when the sound pressure level exceeding the maximum allowable level is caused by noise other than the audio sound, a gain may be determined so that the sound pressure level of the voice becomes equal to the maximum allowable level, and the determined gain may be set as the gain to be applied to the voice. When the sound pressure level of the audio sound is equal to or higher than the sound pressure level of the second noise, the sound pressure level of the audio sound may be reduced by a predetermined value.

One or more of the foregoing objects may be achieved through the provision of an apparatus for improving voice clarity by controlling a gain of a voice based on a sound pressure level of the voice and a sound pressure level of noise.

The apparatus according to a further embodiment of the present invention includes a determining unit that determines whether a sound pressure level of a gain-controlled voice exceeds a maximum allowable level, and an audio sound pressure level control unit that reduces a sound pressure level of audio sound when the sound pressure level of the gain-controlled voice exceeds the maximum allowable level. When the sound pressure level of the gain-controlled voice exceeds the maximum allowable level, the determining unit may determine whether the sound pressure level exceeding the maximum allowable level is caused by the audio sound. When the sound pressure level exceeding the maximum allowable level is caused by the audio sound, the audio sound pressure level control unit may reduce the sound pressure level of the audio sound. The audio sound pressure level control unit may minimally reduce the sound pressure level of the audio sound so that the sound pressure level of the gain-controlled voice becomes equal to or lower than the maximum allowable level.

The apparatus according to another embodiment of the present invention includes a storage unit that generates and stores a correspondence between a sound pressure level of a voice and the gain of the voice for each sound pressure level of noise using loudness compensation, a loudness-compensation-based gain determining unit that determines a sound pressure level of noise and a sound pressure level of a voice and that determines the gain based on the sound pressure level of the voice and the correspondence with respect to the sound pressure level of the noise, a determining unit that determines whether a sound pressure level of the voice to which the determined gain is applied exceeds a maximum allowable level, a cause searching unit that determines whether the sound pressure level exceeding the maximum allowable level is caused by audio sound when the sound pressure level exceeds the maximum allowable level, and an audio sound pressure level control unit that reduces the sound pressure level of the audio sound when the sound pressure level exceeding the maximum allowable level is caused by the audio sound.

In the apparatus according to this embodiment of the present invention, the cause searching unit may determine a sound pressure level of first noise that is the audio sound, may determine a sound pressure level of second sound other than the audio sound based on a sound pressure level of all noise and the sound pressure level of the first noise, may determine a gain based on the correspondence with respect to the sound pressure level of the second noise and a sound pressure level of a voice signal to which the gain has not been applied, and may determine that the sound pressure level exceeding the maximum allowable level is caused by the audio sound when the sound pressure level of the voice signal to which the determined gain is applied does not exceed the maximum allowable level.

In the apparatus according to this embodiment of the present invention, when it is determined that the sound pressure level exceeding the maximum allowable level is caused by the audio sound, the audio sound pressure level control unit may minimally reduce the sound pressure level of the audio sound so that the sound pressure level of the voice to which the gain is applied becomes equal to or lower than the maximum allowable level. That is, when it is determined that the sound pressure level exceeding the maximum allowable level is caused by the audio sound, the audio sound pressure level control unit may determine a gain based on the correspondence with respect to the sound pressure level of all noise and the sound pressure level of the voice while assuming that the sound pressure level of all noise is a preset value higher than the sound pressure level of the second noise, may determine whether a sound pressure level of the voice signal to which the determined gain is applied exceeds the maximum allowable level, may repeatedly determine a gain based on the correspondence with respect to the sound pressure level of all noise and the sound pressure level of the voice while assuming that the sound pressure level of all noise is still the preset value higher when the sound pressure level of the voice signal to which the determined gain is applied does not exceed the maximum allowable level, may determine a maximum sound pressure level of all noise that does not exceed the maximum allowable level, and may determine the sound pressure level of the first noise based on the sound pressure level of all noise and the sound pressure level of the second noise.

The apparatus according to yet another embodiment of the present invention may further include a voice gain control unit that, when the sound pressure level exceeding the maximum allowable level is caused by noise other than the audio sound, determines a gain so that the sound pressure level of the voice becomes equal to the maximum allowable level and that sets the determined gain as the gain to be applied to the voice. The apparatus may further include a unit that notifies a user of voice compensation in a sound limit state when the gain determined so that the sound pressure level of the voice becomes equal to the maximum allowable level is applied to the voice.

Thus, in the presently preferred embodiments, it is determined whether a sound pressure level of a gain-controlled voice exceeds a maximum allowable level, and if the sound pressure level exceeding the maximum allowable level is caused by audio sound, the sound pressure level of the audio sound is reduced and the gain is controlled. Thus, the gain of the voice can be controlled so as not to cause hearing loss, thus providing a high intelligible voice.

Furthermore, a sound pressure level of audio sound may be minimally reduced so that a sound pressure level of a gain-controlled voice becomes equal to or lower than a maximum allowable level. This allows a user to clearly hear a voice while enjoying audio playback sound.

Also, if the sound pressure level exceeding the maximum allowable level is caused by noise other than audio sound, the gain may be determined so that the sound pressure level of the voice becomes equal to the maximum allowable level, and the volume level of the voice signal is controlled by the gain. Thus, the gain of the voice can be controlled so as to have a maximum level allowable against hearing loss to provide an intelligible voice as high as possible.

BRIEF DESCRIPTION OF THE DRAWINGS

FIG. 3 is a correspondence table between volume values and sound pressure levels of an audio sound signal;

DESCRIPTION OF THE PREFERRED EMBODIMENTS

Figure 1:
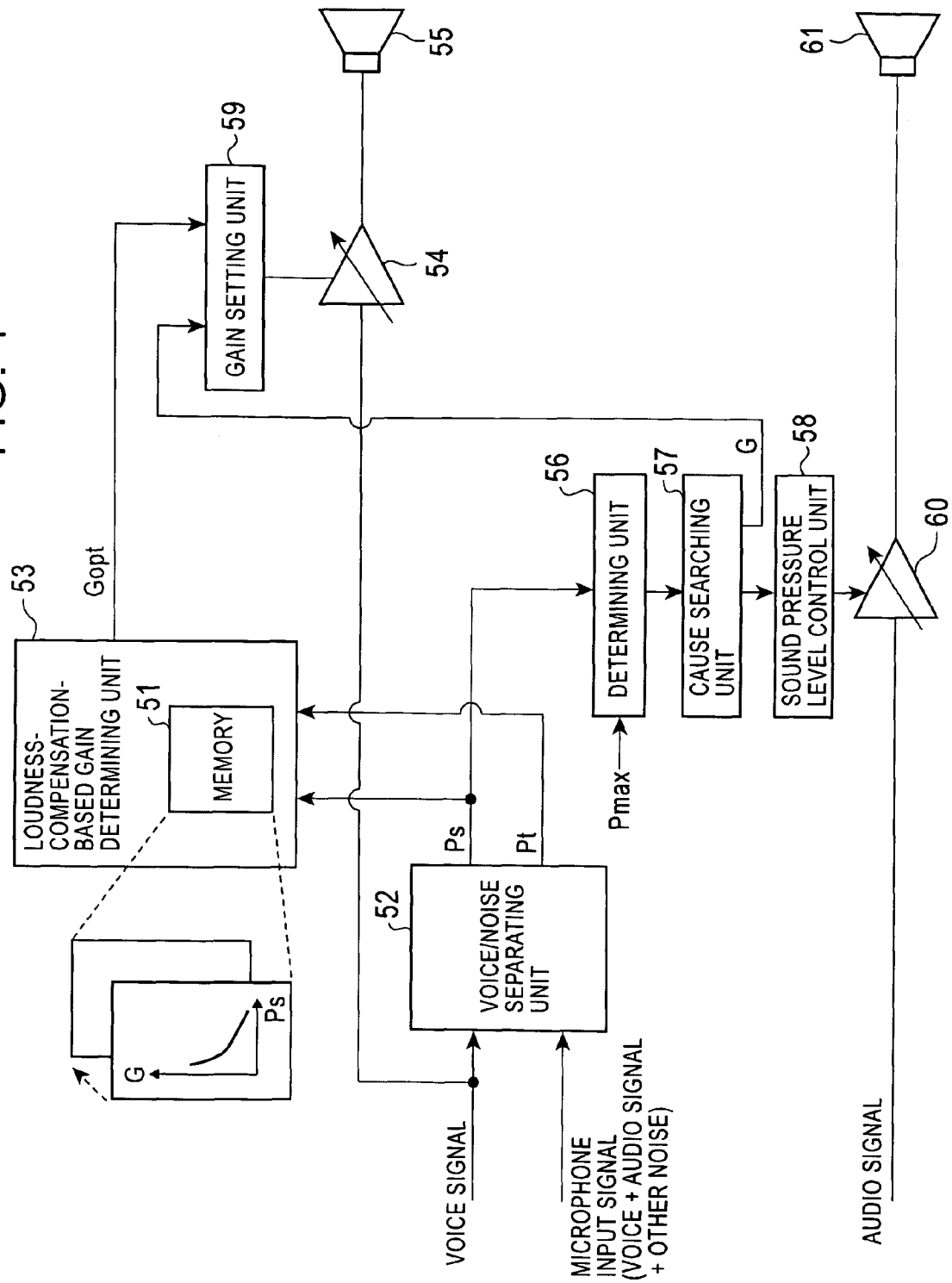
FIG. 1 is a principle diagram of a voice-clarity improving apparatus according to the present invention.

FIG. 1 is a block diagram showing the principle of an apparatus for improving voice clarity according to the present invention. The voice-clarity improving apparatus includes a storage unit 51, a voice/noise separating unit 52, a loudness-compensation-based gain determining unit 53, a gain applying unit 54, a speaker 55 outputting a voice signal, a determining unit 56, a cause searching unit 57, an audio sound pressure level control unit 58, a gain setting unit 59, an attenuator 60 for controlling the sound pressure level of audio sound, and a speaker 61 outputting the audio sound.

The storage unit 51 generates and stores a correspondence (gain-to-amplitude characteristic) between a sound pressure level Ps of a voice and a gain G of the voice for each sound pressure level Pt of noise using the loudness compensation scheme in advance. The voice/noise separating unit 52 separates and outputs a noise signal and a voice signal. The loudness-compensation-based gain determining unit 53 determines an optimum gain Gopt based on the correspondence with respect to the sound pressure level Pt of the noise and the sound pressure level Ps of the voice. The gain applying unit 54 applies the determined gain Gopt to the voice signal, and the voice signal is output from the speaker 55.

The determining unit 56 determines whether the sound pressure level of the voice signal to which the gain Gopt is applied, i.e., Ps+Gopt, exceeds a maximum allowable level Pmax. If the sound pressure level (Ps+Gopt) exceeds the maximum allowable level Pmax, the cause searching unit 57 determines whether the high sound pressure level is caused by audio sound. If it is caused by audio sound, the audio sound pressure level control unit 58 reduces the sound pressure level of the audio sound. In this case, the audio sound pressure level control unit 58 minimally controls the sound pressure level of the audio sound so that the sound pressure level of the voice becomes equal to or lower than the maximum allowable level Pmax. If the high sound pressure level is caused by noise other than audio sound, the gain setting unit 59 determines a gain G (=Pmax−Ps) so that the resulting volume level becomes equal to the maximum allowable level Pmax, and inputs the gain G to the gain applying unit 54.

This allows the voice gain to be controlled to a level that does not cause hearing loss even if the noise level is high, and provides a high intelligible voice. Moreover, the sound pressure level of voice can be made equal to or lower than a maximum allowable level by performing minimal control of the sound pressure level of audio sound, thus providing a high intelligible while allowing a user to enjoy audio playback sound.

Figure 2:
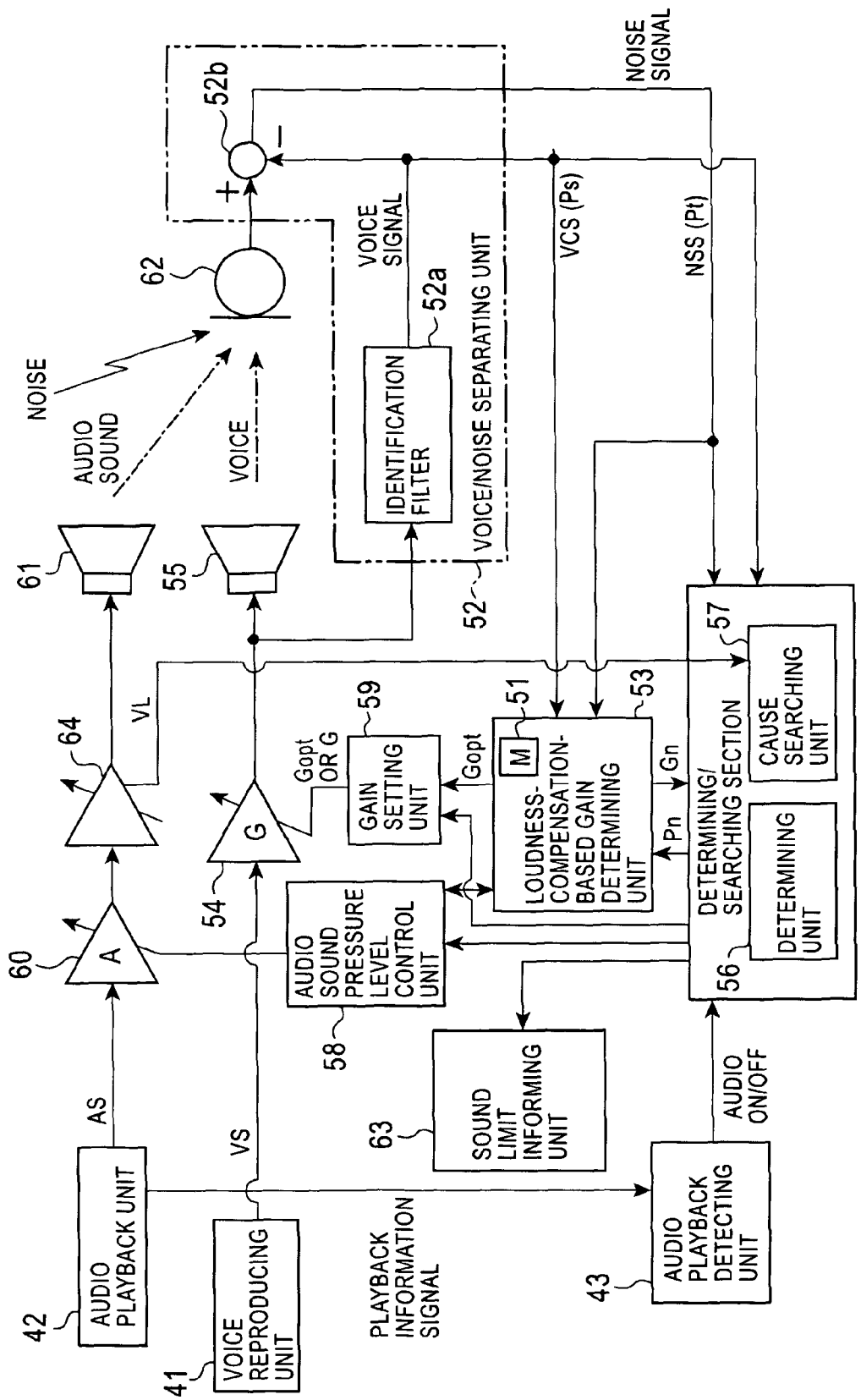
FIG. 2 is a block diagram of a voice-clarity improving apparatus according to the present invention.

FIG. 2 is a block diagram of the voice-clarity improving apparatus according to the present invention. A voice reproducing unit 41 reproduces voice data of voice navigation of a navigation system, guidance instruction of a hands-free system, or the like to output a voice signal VS. An audio playback unit 42 plays back music recorded in a recording medium, such as a CD, a Mini-Disk, a hard disk, or a digital versatile disk (DVD), to output an audio signal AS. An audio playback detecting unit 43 determines whether audio is currently played back, and outputs an audio on/off signal.

Figure 6A:
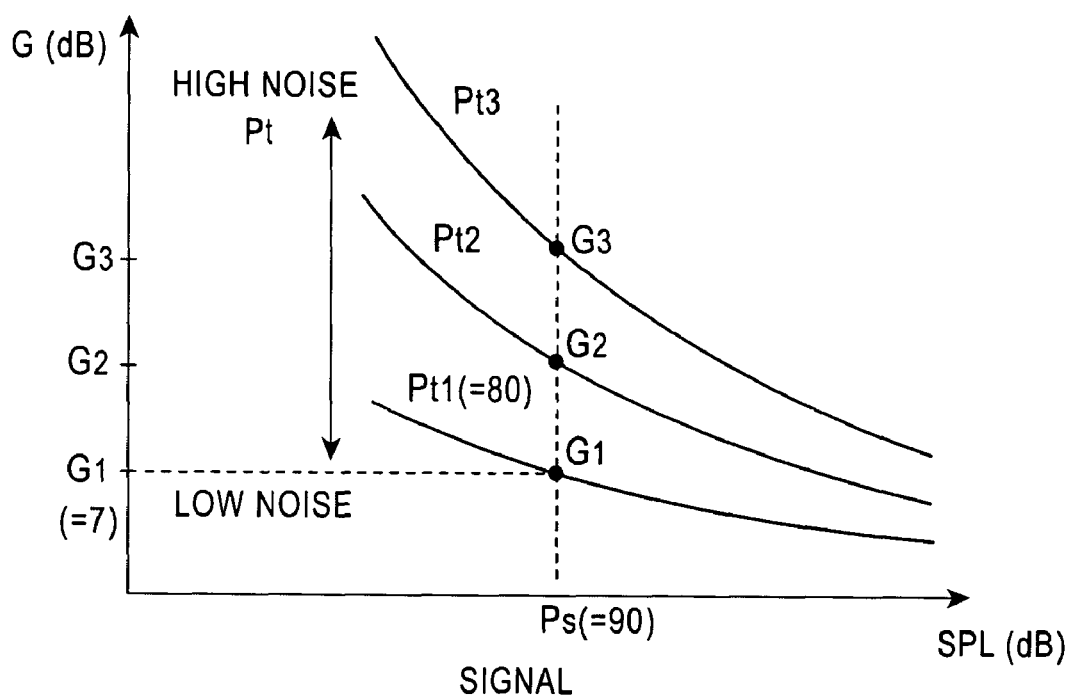
FIGS. 6A and 6B are graphs showing the process for controlling the sound pressure level of audio sound.

The storage unit 51 in the loudness-compensation-based gain determining unit 53 generates and stores a correspondence (see FIG. 6A) between a sound pressure level Ps of a voice and a gain G of the voice for each sound pressure level Pt of noise using loudness compensation in advance.

Figure 7:
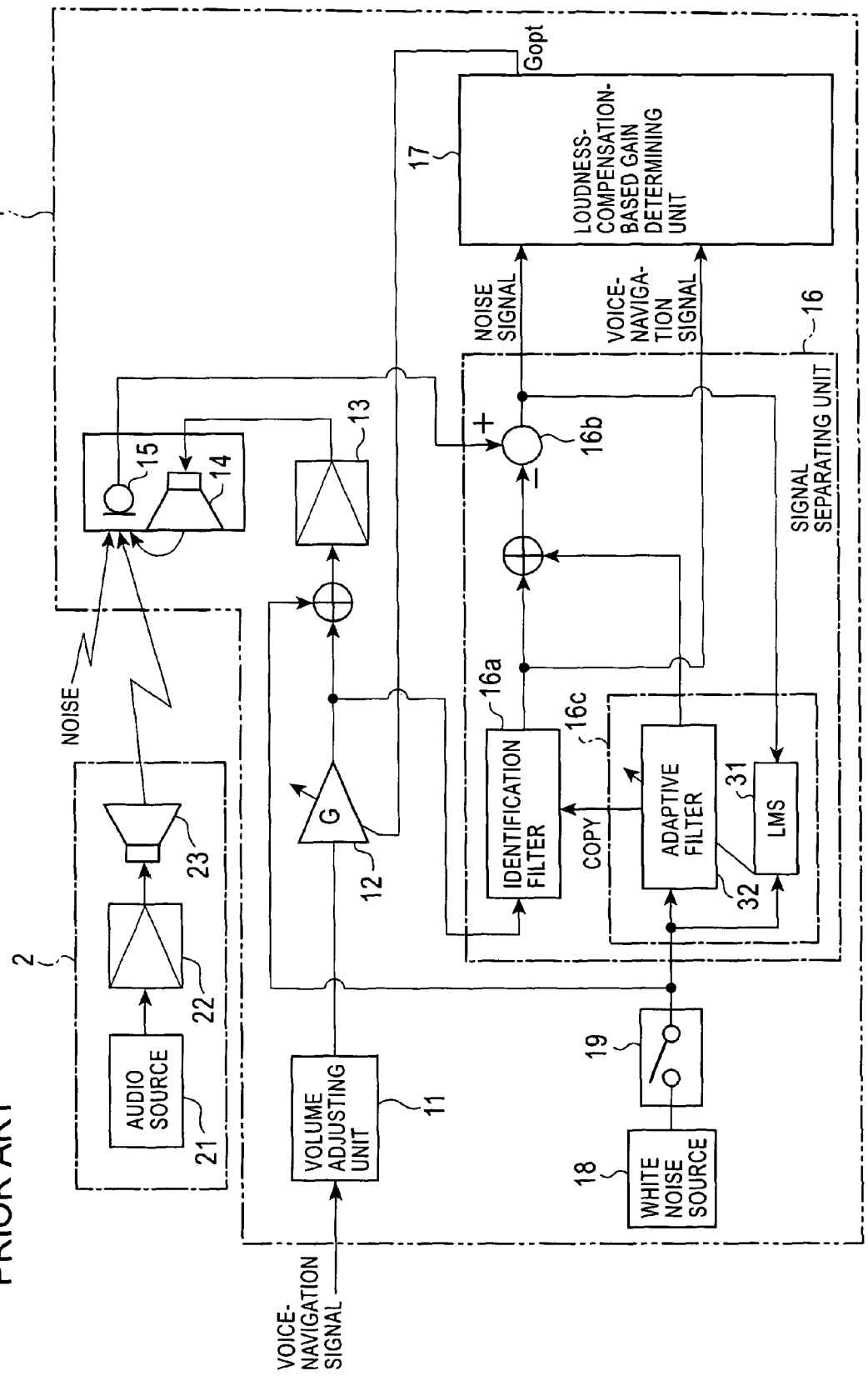
FIG. 7 is a block diagram of a voice-clarity improving apparatus of the related art.
Figure 8:
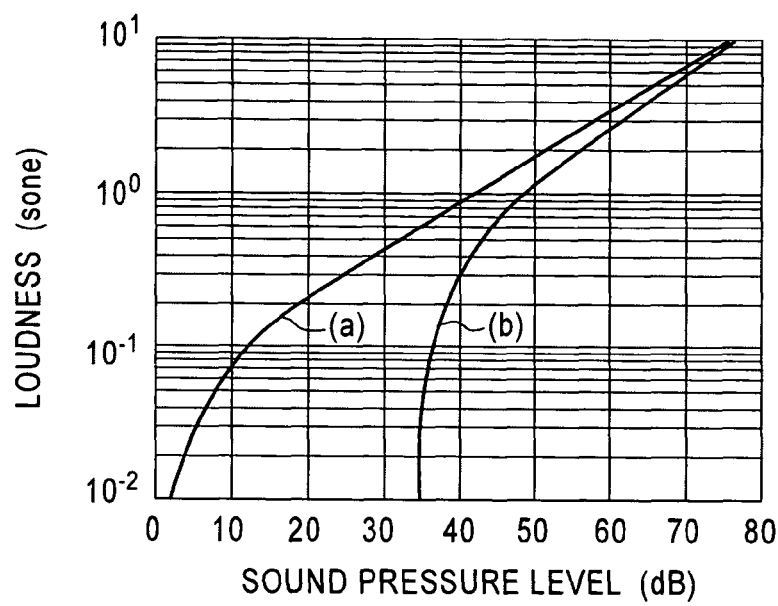
FIG. 8 is a loudness curve.
Figure 9:
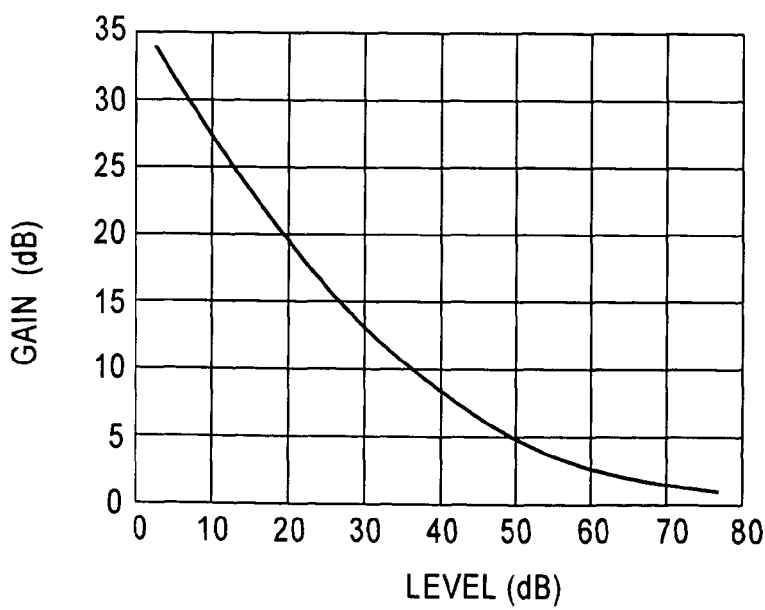
FIG. 9 is a graph showing a gain-to-voice-signal-level characteristic in a noisy environment.
Figure 10:
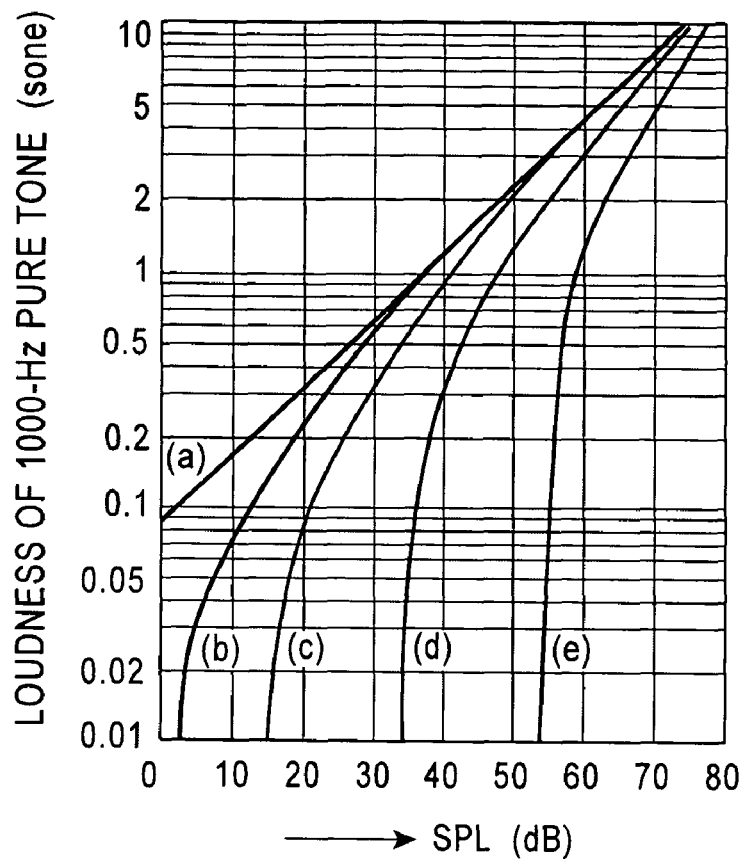
FIG. 10 is a graph showing loudness curves for various noise levels.
Figure 11:
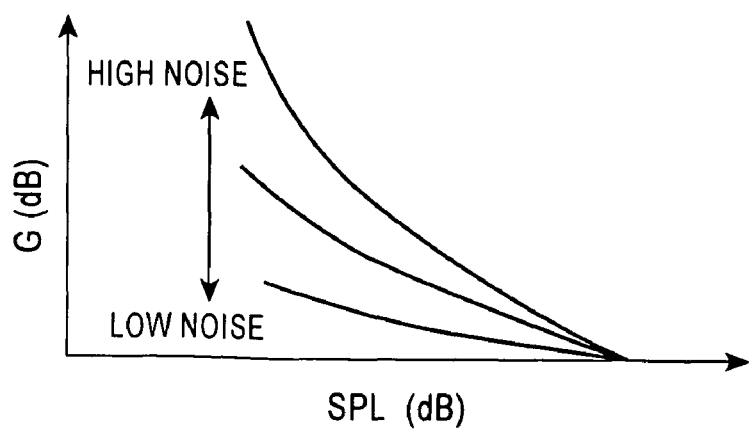
FIG. 11 is a graph showing a gain-to-signal characteristic for various noise levels.

The voice/noise separating unit 52 separates and outputs a noise signal NSS and a voice signal VCS. For the convenience of illustration, only an identification filter 52a and a calculating unit 52b are shown in FIG. 2 although the voice/noise separating unit 52 has the same structure as that of the signal separating unit 16 of the related art shown in FIG. 7. The identification filter 52a has transmission characteristics of an acoustic communication system including the speaker 55 through the microphone 62. Thus, the identification filter 52a obtains the voice signal VCS at the observation point (i.e., at the position of the microphone 62). The calculating unit 52b determines the microphone detection signal exclusive of the voice signal, that is, the noise signal (including the audio sound, the sound of the vehicle engine, and the sound of traveling) NSS.

The loudness-compensation-based gain determining unit 53 determines an optimum gain Gopt based on the correspondence with respect to the sound pressure level Pt of the noise, which is stored in the memory 51, and the sound pressure level Ps of the voice. If the sound pressure level of the voice to which the gain Gopt is applied does not exceed a maximum allowable level Pmax against hearing loss, a gain setting unit 59 continuously sets the determined gain Gopt in the gain applying unit 54. If the sound pressure level of the voice to which the gain Gopt is applied exceeds the maximum allowable level Pmax, the gain setting unit 59 determines a gain G so that the sound pressure level of the voice becomes equal to the maximum allowable level Pmax, and sets the gain G in the gain applying unit 54. The gain applying unit 54 applies (multiplies) the set gain Gopt or G to the voice signal, and outputs the voice signal from the speaker 55.

The determining unit 56 in a determining/searching section determines whether the sound pressure level (Ps+Gopt) of the voice signal to which the gain Gopt is applied exceeds the maximum allowable level Pmax. If the sound pressure level of the voice exceeds the maximum allowable level Pmax, the cause searching unit 57 determines whether the high sound pressure level is caused by audio sound. If it is caused from audio sound, the audio sound pressure level control unit 58 increases the attenuation degree of the attenuator 60 to reduce the sound pressure level of the audio sound. In this case, the audio sound pressure level control unit 58 minimally reduces the sound pressure level of the audio sound so that the sound pressure level of the voice becomes equal to or lower than the maximum allowable level Pmax.

If the high sound pressure level is caused by noise other than the audio sound, the gain setting unit 59 determines a gain G so that the sound pressure level of the voice becomes equal to the maximum allowable level Pmax, and sets the gain G in the gain applying unit 54 to control the volume level of the voice so as to have a maximum value allowable against hearing loss.

A sound limit informing unit 63 gives a visual or audio indication to a user when the sound pressure level of the audio sound is reduced because the sound pressure level of the voice signal exceeds the maximum allowable level Pmax. The sound limit informing unit 63 also gives a visual or audio indication to the user when the volume level of the voice is controlled so as to have a maximum level allowable against hearing loss because the sound pressure level Ps of the voice signal exceeds the maximum allowable level Pmax.

A volume adjusting unit 64 adjusts the volume level of the audio sound, and the cause searching unit 57 in the determining/searching section estimates a sound pressure level Pa of the audio signal based on a volume value VL.

Figure 3:
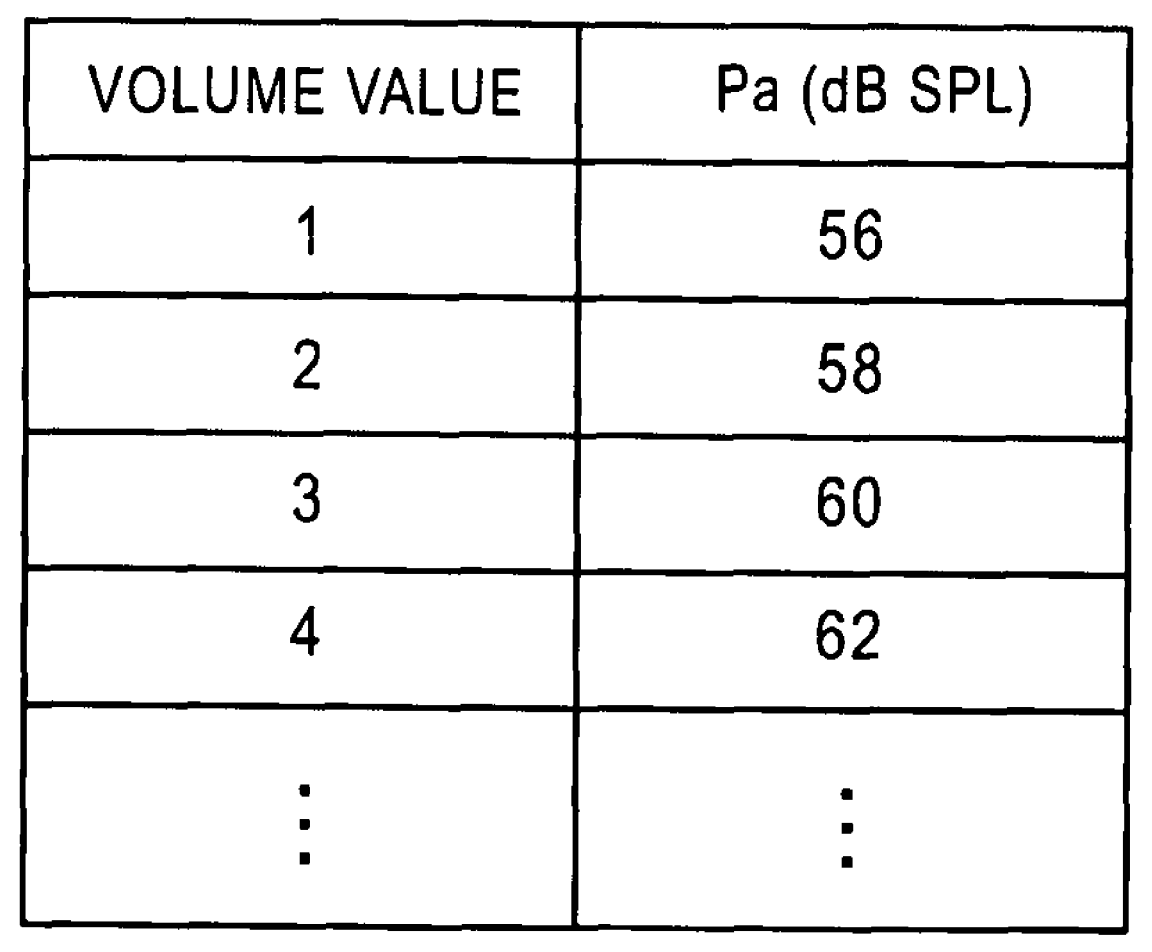

FIG. 3 is a correspondence table between volume values (VL) and sound pressure levels (Pa) of the audio signal. The cause searching unit 57 uses the table to estimate the sound pressure level Pa.

Figure 4:
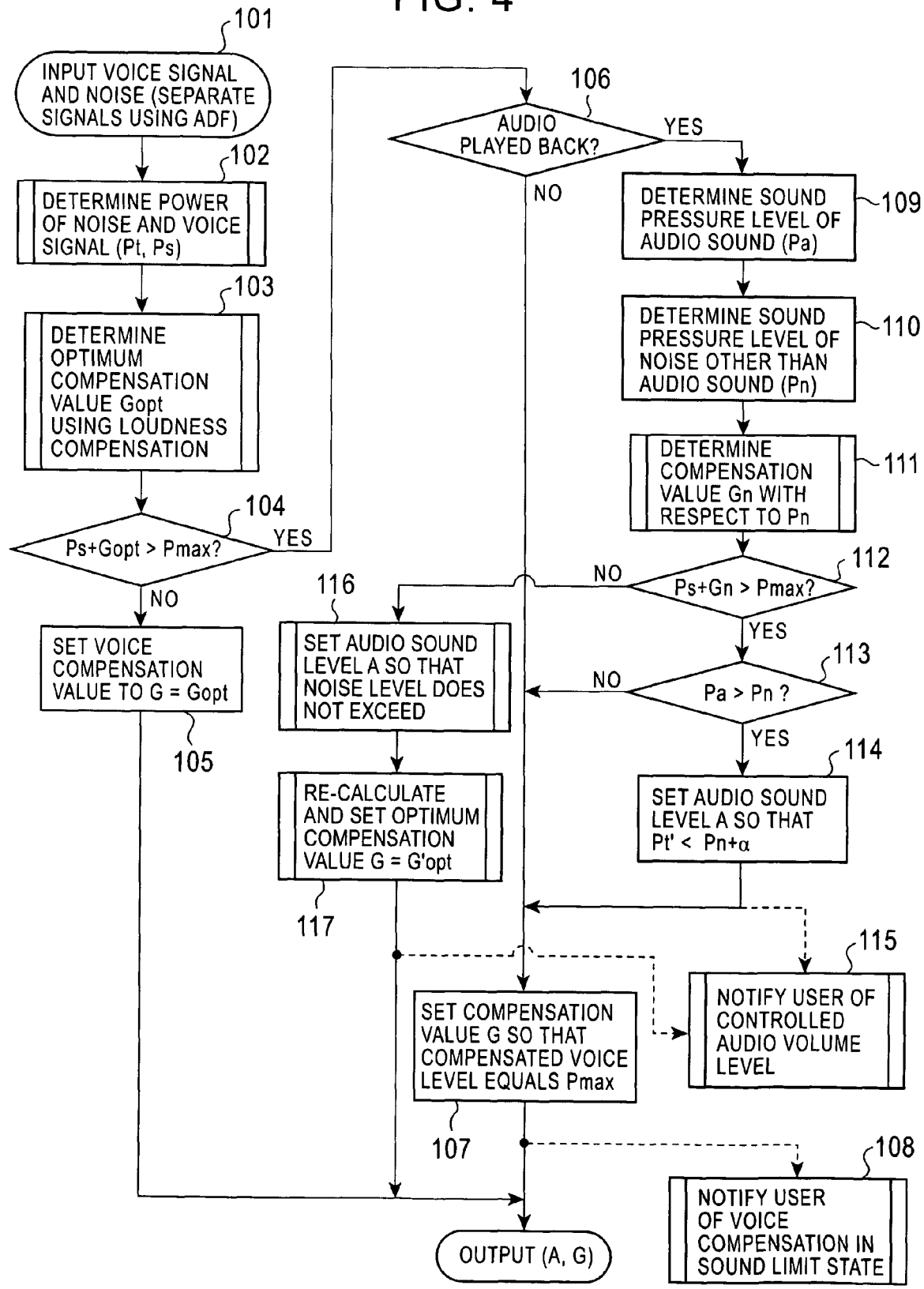
FIG. 4 is a flowchart showing a process for improving voice clarity according to the present invention.

FIG. 4 is a flowchart showing a process for improving voice clarity performed in the voice-clarity improving apparatus according to the present invention.

When normal operation starts, the voice/noise separating unit 52 separates the voice signal VCS and the noise signal NSS (act 101), and determines and outputs the sound pressure level Ps of the voice signal VCS and the sound pressure level Pt of the noise signal NSS (act 102). The sound pressure levels Ps and Pt may be determined by the loudness-compensation-based gain determining unit 51 or the determining/searching section.

The loudness-compensation-based gain determining unit 53 determines an optimum compensation gain Gopt using loudness compensation, and inputs the optimum compensation gain Gopt to the gain applying unit 54 via the gain setting unit 59. The gain applying unit 54 applies (multiplies) the input gain Gopt to the voice signal, and outputs the voice signal from the speaker 55 (act 103).

The determining unit 56 determines whether the sound pressure level (Ps+Gopt) of the voice signal to which the gain Gopt is applied exceeds a maximum allowable level Pmax against hearing loss (act 104). If the sound pressure level does not exceed the maximum allowable level Pmax, this determination is inputted to the gain setting unit 59. As a result, the normal operation continues, and the gain setting unit 59 still sets the gain Gopt input from the loudness-compensation-based gain determining unit 53 in the gain applying unit 54. The gain applying unit 54 applies (multiples) the gain Gopt to the voice signal, and outputs the voice signal from the speaker 55 (act 105).

If the sound pressure level (Ps+Gopt) of the voice signal exceeds the maximum allowable level Pmax (i.e., (Ps+Gopt) >Pmax) in step 104, this determination indicates a sound limit state, and the determining unit 56 determines whether or not audio is currently played back (act 106). If audio is not currently played back, it is determined that noise other than audio sound causes the sound pressure level (Ps+Gopt) of the voice signal to exceed the maximum allowable level Pmax, which indicates that noise other than the audio sound is enabled and is not controllable, and this determination is sent to the gain setting unit 59. In response to this determination, the gain setting unit 59 determines a gain G so that the sound pressure level of the voice becomes equal to the maximum allowable level Pmax by Eq. (1) as follows:

$$G = Pmax - Ps \qquad \text{Eq. (1)}$$

The gain setting unit 59 sets the gain G in the gain applying unit 54, and controls the volume level of the speech so as to have the maximum value allowable against hearing loss (act 107). The sound limit informing unit 63 gives a visual or audio indication to a user that the volume level of the voice is controlled so as to have the maximum level allowable against hearing loss because the sound pressure level (Ps+Gopt) of the voice signal exceeds the maximum allowable level Pmax (act 108).

If audio is currently played back in step 106, the gain searching unit 57 determines whether audio sound or noise other than the audio sound causes the sound pressure level (Ps+Gopt) of the voice signal to exceed the maximum allowable level Pmax. First, the sound pressure level Pa of the audio sound is determined from the volume value VL and the correspondence table (see FIG. 3) (step 109). Then, a sound pressure level Pn of noise other than the audio sound is determined from the sound pressure level Pt of the noise and the sound pressure level Pa of the audio sound (act 110).

A sound pressure level Y (dB SPL) of a signal X is determined by the following equation:

$$Y = 10 \log_{10}(X/X_0)^2$$

where $X_0$ denotes the reference sound pressure level, which is 20 μPa, and $X = 10^{Y/20} \cdot X_0$. Accordingly, the sound pressure level Pn of the noise is given by Eq. (2) as follows:

$$Pn = 10 \log_{10}\left\{\frac{\left(10^{\frac{Pt}{20}} - 10^{\frac{Pa}{20}} \cdot X_0\right)^2}{X_0}\right\} \qquad \text{Eq. (2)}$$

Then, assuming that only noise other than the audio sound exists, the sound pressure level Pn is input to the loudness-compensation-based gain determining unit 53 for determining a gain. The loudness-compensation-based gain determining unit 53 determines a gain Gn corresponding to the sound pressure level Ps of the voice signal from the gain-to-amplitude characteristic with respect to the sound pressure level Pn of the noise, and inputs the gain Gn to the cause searching unit 57 (act 111).

The cause searching unit 57 determines whether the sound pressure level of the voice signal to which the gain Gn is applied exceeds the maximum allowable level Pmax. If it does not exceed the maximum allowable level Pmax, it is determined that the high sound pressure level is caused by the audio sound. If it exceeds the maximum allowable level Pmax, it is determined that the high sound pressure level is caused by noise other than the audio sound. That is, the cause searching unit 57 determines whether the Eq. (3), as set forth above, is satisfied:

$$Ps + Gn > Pmax \qquad \text{Eq. (3)}$$

If Eq. (3) is not satisfied, it is determined the high sound pressure level is caused by the audio sound, which indicates that the audio sound is enabled and is controllable to the normal operation state. If Eq. (3) is satisfied, it is determined that the high sound pressure level is caused by noise other than the audio sound (act 112).

If the high sound pressure level is caused by noise other than the audio sound, the determining unit 56 determines whether the sound pressure level Pa of the audio sound is higher than the sound pressure level Pn of the noise (act 113). If the sound pressure level Pn is higher than the sound pressure level Pa, this determination is sent to the gain setting unit 59. The gain setting unit 59 determines a gain G by Eq. (1) so that the sound pressure level of the voice becomes equal to the maximum allowable level Pmax, and sets the gain G in the gain applying unit 54 to control the volume level of the voice so as to have the maximum value allowable against hearing loss (act 107). The sound limit informing unit 63 gives a visual or audio indication to the user that the volume level of the voice is controlled so as to have the maximum level allowable against hearing loss because the sound pressure level (Ps+Gopt) of the voice signal exceeds the maximum allowable level Pmax (act 108).

If the sound pressure level Pa is higher than the sound pressure level Pn in act 113, it is determined that the high sound pressure level is caused by both the audio sound and noise other than the audio sound, and this determination is sent to the audio sound pressure level control unit 58 and the gain setting unit 59. The audio sound pressure level control unit 58 determines the sound pressure level Pa so that a sound pressure level Pt' of all noise becomes equal to or lower than Pn+α, where α=2.5 dB, and determines the attenuation degree based on the sound pressure level Pa to reduce the sound pressure level of the audio sound.

Specifically, if Pt'=Pn+α, then the values Pt' and Pn are known, and the sound pressure level Pa is determined by Eq. (4) as follows:

$$Pa = 10 \log_{10}(10^{Pt'/10} - 10^{Pn/10}) \qquad \text{Eq. (4)}$$

For example, if Pn=90.0 (dB SPL), then Pt'=92.5 (dB SPL) is obtained. Thus, the sound pressure level Pa is determined as follows:

$$Pa = 10 \log_{10}(10^{92.5/10} - 10^{90.0/10}) = 88.9$$

Therefore, the sound pressure level of the audio sound is reduced to 88.9 (dB SPL) (act 114). The sound limit informing unit 63 gives a visual or audio indication to the user that the sound pressure level of the audio sound is reduced (act 115).

The gain setting unit 59 further determines the gain G by Eq. (1) so that the sound pressure level of the voice becomes equal to the maximum allowable level Pmax, and inputs the gain G to the gain applying unit 54 to control the volume level of the voice so as to have the maximum value allowable against hearing loss (act 107). The sound limit informing unit 63 gives a visual or audio indication to the user that the volume level of the voice is controlled so as to have the maximum level allowable against hearing loss because the sound pressure level (Ps+Gopt) of the voice signal exceeds the maximum allowable level Pmax (act 108).

Figure 5:
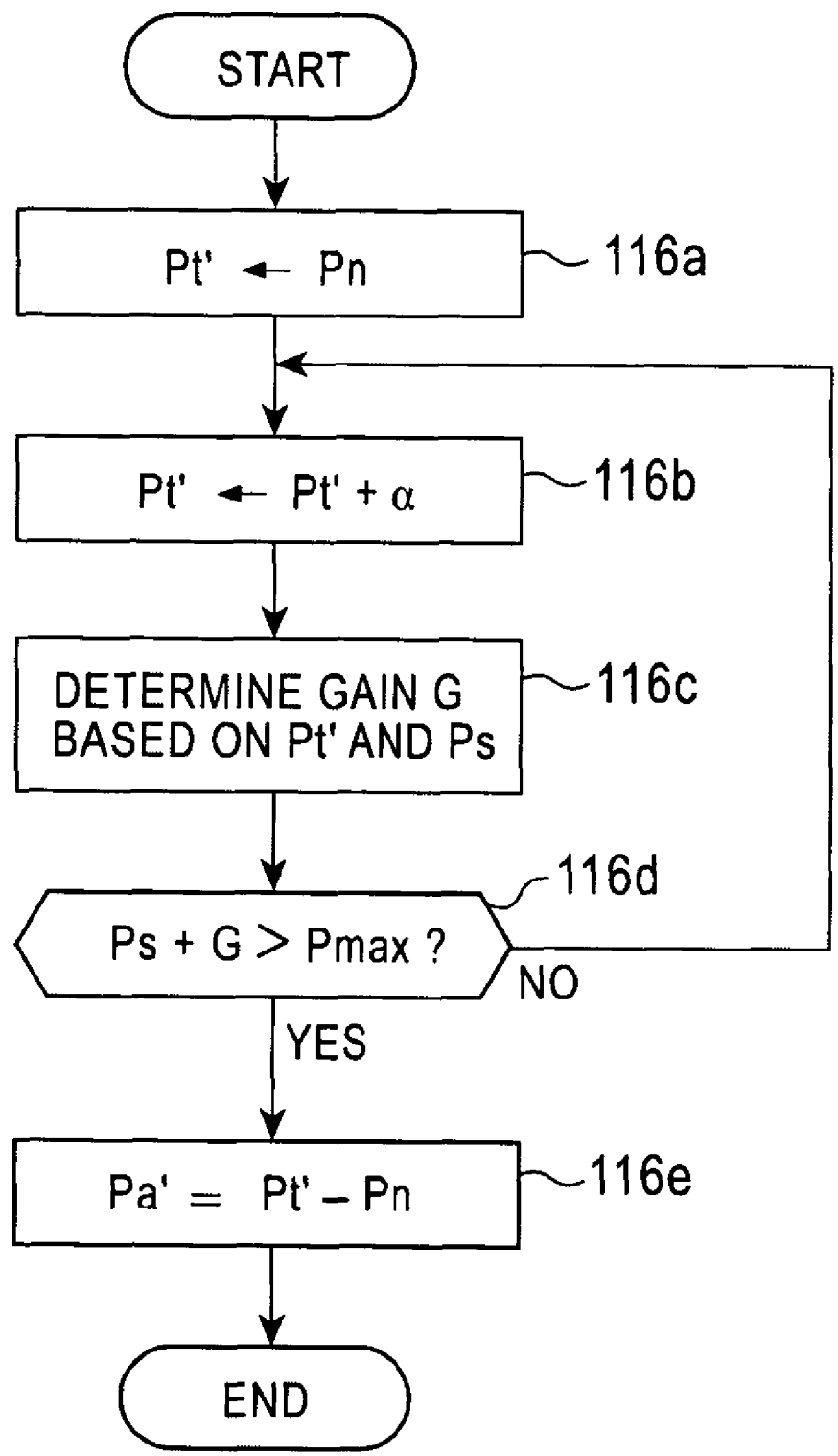
FIG. 5 is a flowchart showing a process for controlling the sound pressure level of audio sound.
Figure 6B:
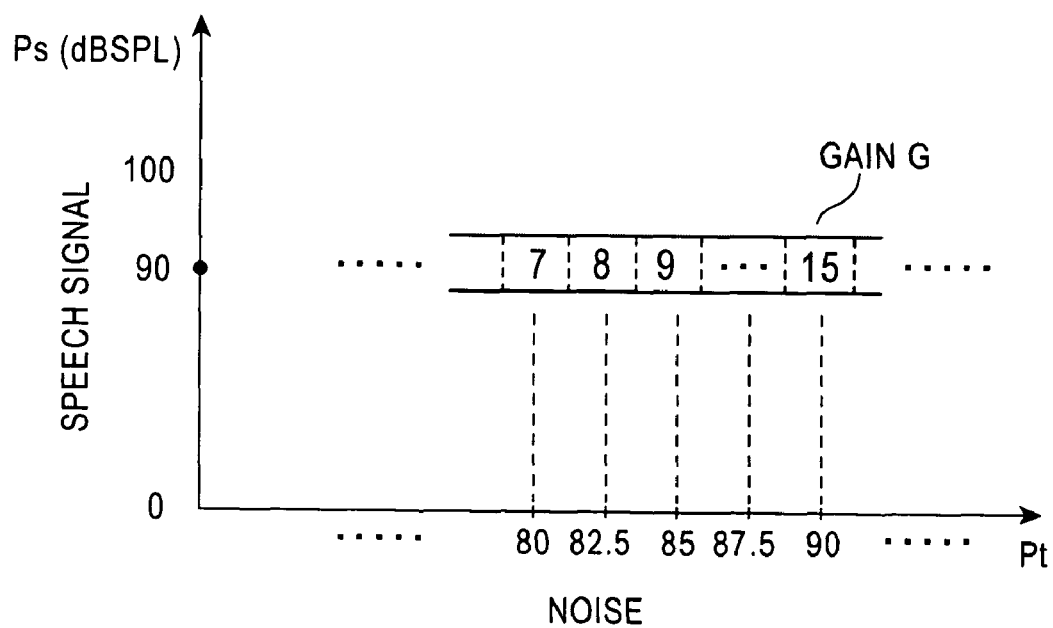

If it is determined in act 112 that the high sound pressure level is caused by the audio sound, the audio sound pressure level control unit 58 sets the audio sound level so that the sound pressure level of the compensated voice signal does not exceed the maximum allowable level Pmax (step 116). That is, the audio sound pressure level control unit 58 uses the signal-to-gain characteristic (see FIG. 6A) for each noise level, which is stored in the memory 51, to generate the correspondence between noise levels Pt and gains G with respect to a constant sound pressure level Ps of the voice signal (e.g., 90 dB SPL), as shown in FIG. 6B. In this state, the audio sound level is determined according to a flowchart shown in FIG. 5.

First, it is assumed (in acts 116a and 116b) that the sound pressure level Pt' of all noise is a preset value α (=2.5 dB) higher than the sound pressure level Pn determined in act 111 shown in FIG. 4. The gain G corresponding to the sound pressure level Pt' of all noise is determined based on the correspondence table shown in FIG. 6B (act 116c). Then, it is determined whether the sound pressure level of the voice signal to which the gain G is applied exceeds the maximum allowable level Pmax. That is, it is determined whether (Ps+G)>Pmax is satisfied (act 116d). If the sound pressure level does not exceed the maximum allowable level Pmax, the process returns to act 116b to repeat the processing described above while assuming that the sound pressure level Pt' of all noise is further the preset value α higher. Thus, the audio sound pressure level control unit 58 determines a maximum sound pressure level Pt' of all noise that does not exceed the maximum allowable level Pmax, and determines the sound pressure level Pa of the audio sound by Eq. (5) as below based on the sound pressure level Pt' of all noise and the sound pressure level Pn of noise other than the audio sound:

$$Pa = 10 \log_{10}(10^{Pt'/10} - 10^{Pn/10}) \quad \text{Eq. (5)}$$

Then, the attenuation degree according to the sound pressure level Pa is set in the attenuator 60 (act 116e).

For example, if Pmax=100 (dB SPL), Pt=90 (dB SPL), Ps=90 (dB SPL), and Gopt=15 dB, then, Ps+Gopt (=105) >Pmax (=100) is satisfied. Thus, in act 104, the compensated value exceeds the maximum allocable level Pmax. If Pn=80 (dB SPL), then Ps=90 (dB SPL) is obtained. Thus, Gn=7 (dB) is determined referring to FIG. 6A.

Since Ps+Gn (=97)<Pmax (=100) is satisfied, NO is obtained in act 112, and it is therefore determined that the high sound pressure level is caused by the audio sound.

Thus, assuming Pt'=Pn+α=82.5 (dB SPL), the gain G (=8) with respect to Ps=90 (dB SPL) is determined referring to FIG. 6B. Then, it is determined whether G>Pmax−Ps is satisfied. Since G>Pmax−Ps is not satisfied, the value α is added to the sound pressure level Pt' of all noise, and the same operation is repeatedly performed until G>Pmax−Ps is satisfied. In this way, the maximum sound pressure level Pt' of the noise signal at which G>Pmax−Ps is not satisfied, that is, 85 (dB SPL), is determined. The resulting sound pressure level Pt' is applied to Eq. (5) to determine the sound pressure level Pa of the audio sound. Thus, the sound pressure level of the audio sound becomes equal to 83.3 (dB SPL).

After the sound pressure level of the audio sound is controlled, the sound limit informing unit 63 gives a visual or audio indication to the user that the sound pressure level of audio sound is reduced (act 115).

Then, the gain Gopt is set to 0, and the sound pressure levels Ps and Pt are determined. The loudness-compensation-based gain determining unit 53 re-calculates an optimum gain G'opt using the sound pressure levels Ps and Pt, and sets the gain G'opt in the gain applying unit 54 (act 117). The gain applying unit 54 applies the gain G'opt to the voice signal, and outputs a voice from the speaker 55.

According to the present invention, therefore, even in a sound limit state where the noise level, e.g., the audio sound level, is high enough to cause hearing loss, improved voice clarity can be realized without causing hearing loss. Thus, a user can comprehend the voice conversion. In addition, once an audio mute function is activated, a vehicle driver can pay attention to the voice output device, thus realizing reliable correction.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

What is claimed is:

1. A method for improving voice clarity by controlling a gain of a voice based on a sound pressure level of the voice and a sound pressure level of noise, comprising:
   determining whether a sound pressure level of a gain-controlled voice exceeds a maximum allowable level, the determination being performed by a determining unit;
   determining whether the sound pressure level exceeding the maximum allowable level is caused by an audio sound when the sound pressure level of the gain-controlled voice exceeds the maximum allowable level, the determination being performed by a cause searching unit; and
   reducing a sound pressure level of audio sound when the sound pressure level of the gain-controlled voice exceeds the maximum allowable level, wherein the sound pressure level of the audio sound is minimally reduced so that the sound pressure level of the gain controlled voice becomes equal to or lower than the maximum allowable level, the reduction in sound pressure level being performed by an audio sound pressure level control unit.

2. A computer implemented method for improving voice clarity by controlling a gain of a voice based on a sound pressure level of the voice and a sound pressure level of noise, comprising:
   generating and storing, with a processor, a correlation between a sound pressure level of a voice and the gain of the voice for each sound pressure level of noise using loudness compensation;
   determining, with a processor, a sound pressure level of noise and a sound pressure level of a voice;
   determining, with a processor, the gain based on the sound pressure level of the voice and the correlation with respect to the sound pressure level of the noise;
   determining, with a processor, whether a sound pressure level of the voice to which the determined gain is applied exceeds a maximum allowable level;
   determining, with a processor, whether the sound pressure level exceeding the maximum allowable level is caused by audio sound when the sound pressure level to which the determined gain is applied exceeds the maximum allowable level; and
   reducing, with a processor, the sound pressure level of the audio sound when the sound pressure level exceeding the maximum allowable level is caused by the audio sound, wherein the sound pressure level of the audio sound is minimally reduced so that the sound pressure level of the voice to which the gain is applied becomes equal to or lower than the maximum allowable level.

3. The method of claim 2, further comprising the act of notifying a user of a reduction in the sound pressure level of the audio sound when the sound pressure level of the audio sound is reduced.

4. The method of claim 2, further comprising the acts of determining, with a processor, a sound pressure level of first noise, the first noise comprising the audio sound;

determining, with a processor, a sound pressure level of a second noise based on a sound pressure level of all noise and the sound pressure level of the first noise;

determining, with a processor, a gain based on the correspondence with respect to the sound pressure level of the second noise and a sound pressure level of the voice to which the gain has not been applied;

determining, with a processor, whether a sound pressure level of a voice signal to which the determined gain is applied exceeds the maximum allowable level; and determining, with a processor, whether the sound pressure level exceeding the maximum allowable level is caused by the audio sound when the sound pressure level of the voice signal to which the determined gain is applied does not exceed the maximum allowable level.

5. The method of claim 4, wherein the sound pressure level of the first noise is determined based on a set volume value of the audio sound.

6. The method of claim 4, further comprising the acts of determining, with a processor, the gain based on the correlation with respect to the sound pressure level of all noise and the sound pressure level of the voice while assuming that the sound pressure level of all noise is a preset value higher than the sound pressure level of the second noise when the sound pressure level exceeding the maximum allowable level is caused by the audio sound;

determining, with a processor, whether a sound pressure level of the voice signal to which the determined gain is applied exceeds the maximum allowable level, determining, with a processor, the gain based on the correlation with respect to the sound pressure level of all noise and the sound pressure level of the voice while assuming that the sound pressure level of all noise is still the preset value higher when the sound pressure level of the voice signal to which the determined gain is applied does not exceed the maximum allowable level; and determining, with a processor, a maximum sound pressure level of all noise that does not exceed the maximum allowable level.

7. The method of claim 2, further comprising the act of determining, with a processor, a gain so that the sound pressure level of the voice becomes equal to the maximum allowable level, and the determined gain is set as the gain to be applied to the voice when the sound pressure level exceeding the maximum allowable level is caused by noise other than the audio sound.

8. The method of claim 7, further comprising the acts of notifying a user of voice compensation in a sound limit state when the gain determined.

9. The method of claim 7, wherein the sound pressure level of the audio sound is reduced by a predetermined value when the sound pressure level of the audio sound is equal to or higher than the sound pressure level of a second noise.

10. An apparatus for improving voice clarity by controlling a gain of a voice based on a sound pressure level of the voice and a sound pressure level of noise, comprising:

a determining unit configured to determine whether a sound pressure level of a gain-controlled voice exceeds a maximum allowable level; and an audio sound pressure level control unit configured to reduce a sound pressure level of audio sound when the sound pressure level of the gain controlled voice exceeds the maximum allowable level, wherein, when the sound pressure level of the gain-controlled voice exceeds the maximum allowable level, the determining unit determines whether the sound pressure level exceeding the maximum allowable level is caused by the audio sound, and wherein the audio sound pressure level control unit minimally reduces the sound pressure level of the audio sound so that the sound pressure level of the gain-controlled voice becomes equal to or lower than the maximum allowable level.

11. An apparatus for improving voice clarity by controlling a gain of a voice based on a sound pressure level of the voice and a sound pressure level of noise, comprising:

storing means for generating and storing a correspondence between a sound pressure level of a voice and the gain of the voice for each sound pressure level of noise using loudness compensation;

a loudness-compensation-based gain determining unit configured to determine a sound pressure level of noise and a sound pressure level of a voice and determine the gain based on the sound pressure level of the voice and the correspondence with respect to the sound pressure level of the noise;

a determining unit configured to determine whether a sound pressure level of the voice to which the determined gain is applied exceeds a maximum allowable level;

a cause searching unit configured to determine whether the sound pressure level exceeding the maximum allowable level is caused by audio sound when the sound pressure level to which the determined gain is applied exceeds the maximum allowable level;

an audio sound pressure level control unit configured to reduce the sound pressure level of the audio sound when the sound pressure level exceeding the maximum allowable level is caused by the audio sound; and a voice gain control unit configured to, when the sound pressure level exceeding the maximum allowable level is caused by noise other than the audio sound, determine a gain so that the sound pressure level of the voice becomes equal to the maximum allowable level and set the determined gain as the gain to be applied to the voice.

12. The apparatus of claim 11, further comprising a notifying means for notifying a user of a reduction in the sound pressure level of the audio sound when the sound pressure level of the audio sound is reduced.

13. The apparatus of claim 11, wherein the cause searching unit determines a sound pressure level of first noise, the first noise comprising the audio sound, determines a sound pressure level of second sound other than the audio sound based on a sound pressure level of all noise and the sound pressure level of the first noise, determines a gain based on the correspondence with respect to the sound pressure level of the second noise and a sound pressure level of a voice signal to which the gain has not been applied, and determines that the sound pressure level exceeding the maximum allowable level is caused by the audio sound when the sound pressure level of the voice signal to which the determined gain is applied does not exceed the maximum allowable level.

14. The apparatus of claim 13, wherein the audio sound pressure level control unit minimally reduces the sound pressure level of the audio sound so that the sound pressure level of the voice to which the gain is applied becomes equal to or lower than the maximum allowable level when it is determined that the sound pressure level exceeding the maximum allowable level is caused by the audio sound.

15. The apparatus of claim 13, wherein when it is determined that the sound pressure level exceeding the maximum allowable level is caused by the audio sound, the audio sound pressure level control unit determines a gain based on the correspondence with respect to the sound pressure level of all noise and the sound pressure level of the voice while assuming that the sound pressure level of all noise is a preset value higher than the sound pressure level of the second noise, determines whether a sound pressure level of the voice signal to which the determined gain is applied exceeds the maximum allowable level, repeatedly determines a gain based on the correspondence with respect to the sound pressure level of all noise and the sound pressure level of the voice while assuming that the sound pressure level of all noise is still the preset value higher when the sound pressure level of the voice signal to which the determined gain is applied does not exceed the maximum allowable level, determines a maximum sound pressure level of all noise that does not exceed the maximum allowable level, and determines the sound pressure level of the first noise based on the sound pressure level of all noise and the sound pressure level of the second noise.

16. The apparatus of claim 11, further comprising means for notifying a user of voice compensation in a sound limit state when the gain is determined so that the sound pressure level of the voice becomes equal to the maximum allowable level applied to the voice.

17. The apparatus of claim 11, wherein the audio sound pressure level control unit reduces the sound pressure level of the audio sound by a predetermined value when the sound pressure level of the audio sound is equal to or higher than the sound pressure level of the second noise.

* * * * *